United States Patent [19]
Puri et al.

[11] Patent Number: 5,621,351
[45] Date of Patent: Apr. 15, 1997

[54] MODULATION AMPLIFIER FOR RADIO TRANSMITTERS

[75] Inventors: Narindra N. Puri, Monmouth Jct., N.J.; Patrick Gehri, Riniken, Switzerland; Bohumil Kyrian, Unterbozberg, Switzerland; Peter Niklaus, Wettingen, Switzerland; Juraj Tomljenovic, Tegerfelden, Switzerland; Nenad Tomljenovic, Nussbaumen, Switzerland

[73] Assignee: Thomcast AG, Turgi, Switzerland

[21] Appl. No.: 331,481

[22] PCT Filed: Mar. 3, 1994

[86] PCT No.: PCT/CH94/00045

§ 371 Date: Jan. 27, 1995

§ 102(e) Date: Jan. 27, 1995

[87] PCT Pub. No.: WO94/21035

PCT Pub. Date: Sep. 15, 1994

[30] Foreign Application Priority Data

Mar. 4, 1993 [DE] Germany ............ 43 06 690.9

[51] Int. Cl.⁶ ..................................... H03F 3/38
[52] U.S. Cl. .................. 330/10; 330/124 R; 332/145
[58] Field of Search ................ 330/10, 124 R, 330/201 A, 251; 332/145

[56] References Cited

U.S. PATENT DOCUMENTS 4,164,714  8/1979  Swanson ................... 330/10
4,862,116  8/1989  Olver ...................... 332/145
4,870,374  9/1989  Harris ..................... 332/145

Primary Examiner—Steven Mottola
Attorney, Agent, or Firm—Oblon, Spivak, McClelland, Maier & Neustadt, P.C.

[57] ABSTRACT

A modulation amplifier includes a signal converter, a summator and a plurality of high frequency stages ($3_{1-m}$ or $4_{1-n}$). The high frequency stages ($3_{1-m}$) are driven by equiphased control signals ($s_{1-m}$); the high frequency stages ($4_{1-n}$) are driven by control signals ($t_{1-n}$) of different phase $\Phi_{1-n}$. The high frequency stages ($3_{1-m}$ or $4_{1-n}$) can be selected in an arbitrary manner by the control signals ($s_{1-m}$ or $t_{1-n}$). The summator adds the high frequency output signals ($x_{1-m}$ or $y_{1-n}$) of the high frequency stages ($3_{1-m}$ or $4_{1-n}$). The output signal can be conveyed, for example, to a low pass and a subsequent load. The phases ($\Phi_{1-n}$) of the output signals ($y_{1-n}$) of the high frequency stages ($4_{1-n}$) correspond to those of the control signals ($t_{1-n}$). So many high frequency stages ($3_{1-m}$) are selected that there is at the output of the summator a high frequency oscillation, whose amplitude changes by steps in accordance with the low frequency signal. In addition, so many high frequency stages ($4_{1-n}$) with different phases ($\Phi_{1-n}$) are selected that the sum of the outputs ($y_{1-n}$) corresponds to the difference of the amplified amplitude of the low frequency signal and the coarse approximation of the low frequency signal to the sum of the output signals ($x_{1-m}$).

11 Claims, 5 Drawing Sheets

MODULATION AMPLIFIER FOR RADIO TRANSMITTERS

TECHNICAL FIELD

The invention relates to the field of radio transmitter technology. It is based on a modulation amplifier according to the preamble of the first claim.

STATE OF THE ART

Such a modulation amplifier is already known from the European patent EP-B1-0 083 727.

A modulation amplifier of this kind comprises a signal converter, which converts a low frequency input signal into a multiple of control signals, a plurality of high frequency stages, which are driven by the control signals, and a high frequency oscillator.

The high frequency stages can be turned on and off independently and send a high frequency signal to their outputs. The output signals of these high frequency stages are added in a summator. So many stages are always driven or turned on now that the amplitude of the high frequency composite signal changes by steps in accordance with the low frequency input signal. In this manner the low frequency signal modulates the amplitude of a high frequency oscillation. One can simultaneously increase the power by adding the output signals of the high frequency stages, which can amount, e.g., to a few hundred volts.

There are also means that serve to approximate the difference of the step-shaped composite signal and the low frequency amplitude to be amplified.

These means comprise in the aforementioned document four high frequency stages with binarily weighted amplitudes of ½, ¼, ⅛ and 1/16 of the amplitude of the other 31 coarse stages.

The drawback with this arrangement is that different types of stages have to be used and a lot more stress is put over time on the stages with the binarily weighted amplitude than on the other similar coarse stages. Since the stages are not stressed uniformly, the modulation amplifier is inherently susceptible to interference. If binarily weighted stages are defective, the other stages cannot assume their task. Consequently there is a range of high frequency noise that has a detrimental effect on the neighboring channels and decreases the low frequency quality.

There exists a special kind of amplitude modulation—the socalled ampliphase modulation—from various older publications (H. Chireix: "High Power Outphasing Modulation" in Proceedings of the Institute of Radio Engineers, vol. 23, no. 11, November 1935; G. Clark: "A Comparison of Current Broadcast Amplitude Modulation Techniques", in IEEE Transactions on Broadcasting, vol. BC-21, no. 2, June 1975; D. R. Mousson: "Ampliphase for Economical Super-Power AM Transmitters", in Broadcast Transmitter Engineering; F. J. Casadevall: "The LINC Transmitter", in RF Design, February 1990).

This kind of modulation is used for a transmitter in the European patent application EP-A2-0 273 827. This transmitter comprises two partial transmitters, which are driven with different phases, a unit, which controls the phases of the transmitters as a function of an input signal, and a summation network, which adds the output signals of both partial transmitters, in such a manner that an amplitude and phase modulated signal, whose amplitude changes in accordance with the input signal, is sent to the subsequent antenna. By dividing the transmitter into two partial transmitters the total transmitting power is divided between the two partial transmitters, so that each partial transmitter has to exhibit only a part of the total power.

PRESENTATION OF THE INVENTION

The object of the present invention is to provide a modulation amplifier, whose means for fine approximation do not represent inherent sources of error.

This problem with a modulation amplifier of the aforementioned kind is solved by means of the features of the first claim.

Thus, the essence of the invention is that the means for fine approximation and coarse approximation comprise similar stages, where the fine stages are driven with different phases. Thus, the coarse and fine stages differ only in the phases of the selection and output signals. Their internal construction, however, is identical. The same applies to the output amplitudes and output frequency.

In a first embodiment the number of stages that are driven with the same phase is larger than the number of stages that are driven with different phases. The result is a modulation amplifier, where the summed output signal of the equiphase stages exhibits an essentially step-shaped amplitude response, whereas the fine approximation is done by stages with different phases.

In a second embodiment the number of stages that are driven with the same phase is smaller than the number of stages that are driven with different phases. In the extreme case even all stages with different phases are selected. Thus, the result is a modulation amplifier, whose output signal amplitude varies in accordance with a low frequency input signal and is approximated by means of the sum of a plurality of equifrequent oscillations with different phase.

Other embodiments follow from the dependent claims.

The advantage of the construction according to the invention is that all of the used stages exhibit the same construction and the same output amplitudes and are driven only by different control signals. The result is a modulation amplifier, which is characterized by simplicity and sturdiness. The similarity of the stages also allows greater flexibility with respect to the construction of the amplifier, so that not only amplifiers, in which only the fine approximation is realized by means of out-of-phase signals, but also amplifiers, in which the total approximation is realized by means of out-of-phase signals, can be constructed with the same means.

With the construction of the invention the error source, which afflicts a modulation amplifier due to non-uniform stress on all stages, is avoided.

BRIEF DESCRIPTION OF THE DRAWINGS

In the following the invention is explained in detail with reference to the embodiments and the drawings.

The reference numerals, used in the drawings, and their meanings are summarized in the list of reference numerals. In principle identical parts are provided with identical reference numerals in the Figures.

METHODS FOR IMPLEMENTING THE INVENTION

A signal of the kind $A\cos(2\pi f_0 t + \Phi(t))$ can be shown as vectors, which exhibit the length A and rotate with the angular frequency $w_0 = 2\pi f_0$ and the phase $\Phi(t)$.

Figure 1:
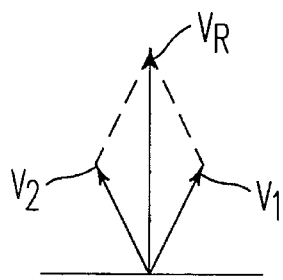
FIG. 1 is a vector drawing of the addition of two signals with different phase.

FIG. 1 shows the vector addition of two signals V1 and V2 with identical amplitude and frequency, but different phase. V1 corresponds to the signal s1; V2, the signal s2.

$$
\begin{aligned}
\text{With } s1(t) &= A\cos(w_0 t + \Phi 1) \text{ and} \\
s2(t) &= A\cos(w_0 t + \Phi 2) \\
s1(t) + s2(t) &= A\cos(w_0 t + \Phi 1) + A\cos(w_0 t + \Phi 2) \\
&= A(\cos w_0 t \cos\Phi 1 - \sin w_0 t \sin\Phi 1) + \\
&\quad A(\cos w_0 t \cos\Phi 2 - \sin w_0 t \sin\Phi 2) \\
&= A\cos w_0 t(\cos\Phi 1 + \cos\Phi 2) - \\
&\quad A\sin w_0 t(\sin\Phi 1 + \sin\Phi 2) \\
&= 2A\cos w_0 t \left[\cos\frac{\Phi 1+\Phi 2}{2}\cos\frac{\Phi 1-\Phi 2}{2}\right] - \\
&\quad 2A\sin w_0 t \left[\sin\frac{\Phi 1+\Phi 2}{2}\cos\frac{\Phi 1-\Phi 2}{2}\right] \\
&= 2A\cos\frac{\Phi 1-\Phi 2}{2}\cos\left(w_0 t + \frac{\Phi 1+\Phi 2}{2}\right) \\
&= B\cos(w_0 t + \Phi)
\end{aligned}
$$

with $B = 2A\cos\frac{\Phi 1-\Phi 2}{2}$ and $\Phi = \frac{\Phi 1+\Phi 2}{2}$

Thus, the sum of both signals represents a vector $V_R$, which rotates with the angular frequency $w_0$ and the phase $\Phi$ and whose amplitude depends on the phases of both addends V1 or V2. In the maximum case ($\Phi 1-\Phi 2=0$) the amplitude B becomes twice as large as the original amplitudes; in the minimum ($\Phi 1-\Phi 2=180°$) B becomes zero.

Thus, the amplitude of the resulting signal can be specifically modified by controlling the phases $\Phi 1$ and $\Phi 2$. This procedure is used for the type of modulation called "ampliphase".

In so doing, two oscillations with identical frequency f0, but different phase are added. If the oscillations are imagined as rotating vectors, then it becomes immediately clear that by controlling the phase shift of the component vectors the amplitude of the resulting composite vector can also be modified. Naturally it can be done in such a manner that the amplitude of the resulting vector changes in accordance with a useful signal. The result is an oscillation of the frequency f0, whose amplitude changes in accordance with the useful signal, in other words an amplitude-modulated oscillation.

Assuming that all partial signals are supposed to exhibit the same amplitude (similar stages), i.e. the ends of the vectors lie on a circle, then it becomes immediately clear that a modulation in the above context can also be performed with a plurality of signals.

It is now known from the EP-B1-0 083 727 that the amplitude response of a low frequency signal to be amplified and modulated can be approximated by an addition of multiple, equifrequency and phase-modulated high frequency sources. The result of such an approximation is a high frequency oscillation with step-shaped envelop, as shown in FIG. 3.

Figure 3:
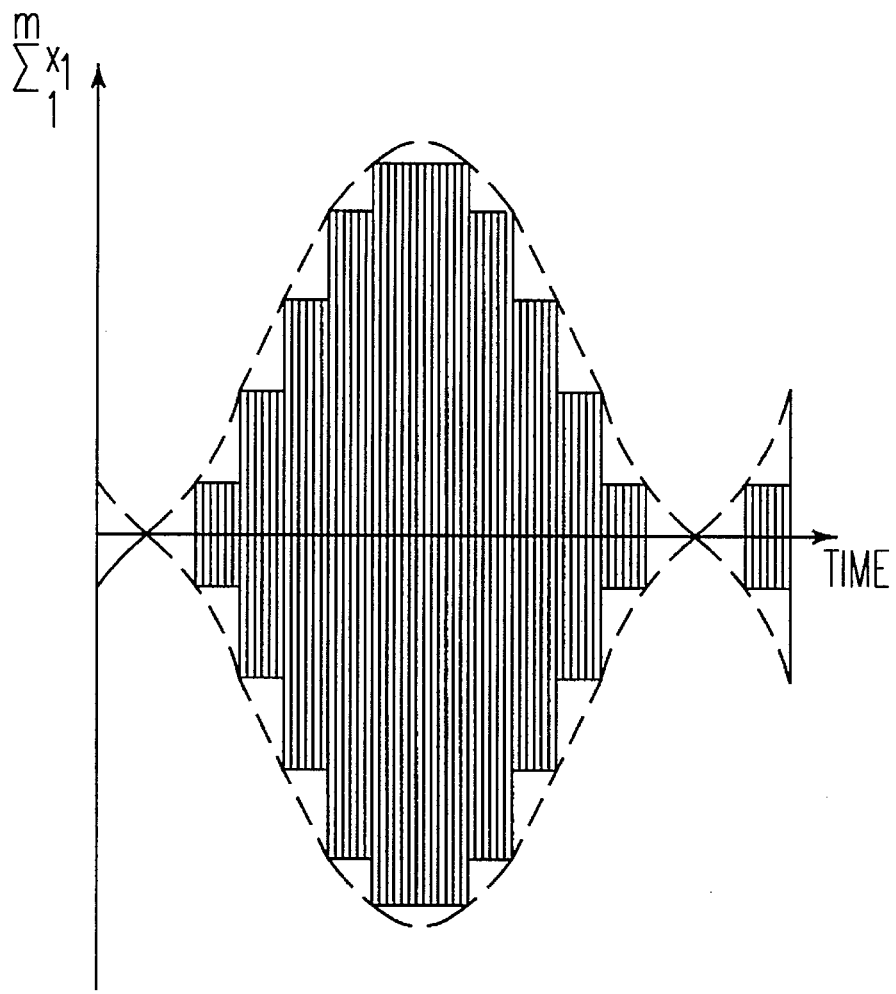
FIG. 3 depicts the coarse approximation of a low frequency signal by means of several, equiphase high frequency signals.
Figure 4:
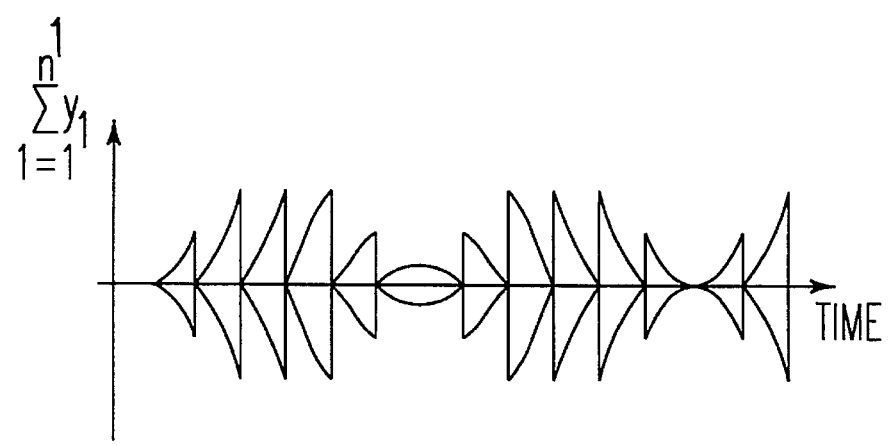
FIG. 4 depicts the fine approximation of the difference of the amplitude response of the amplified low frequency signal and the coarse approximation according to FIG. 3.

The idea of the invention is now to approximate the difference of the amplified amplitude response, shown as a dashed line in FIG. 3, and the step-shaped envelop of the high frequency composite oscillation, shown in FIG. 4, by means of multiple, out-of-phase high frequency sources.

Figure 2:
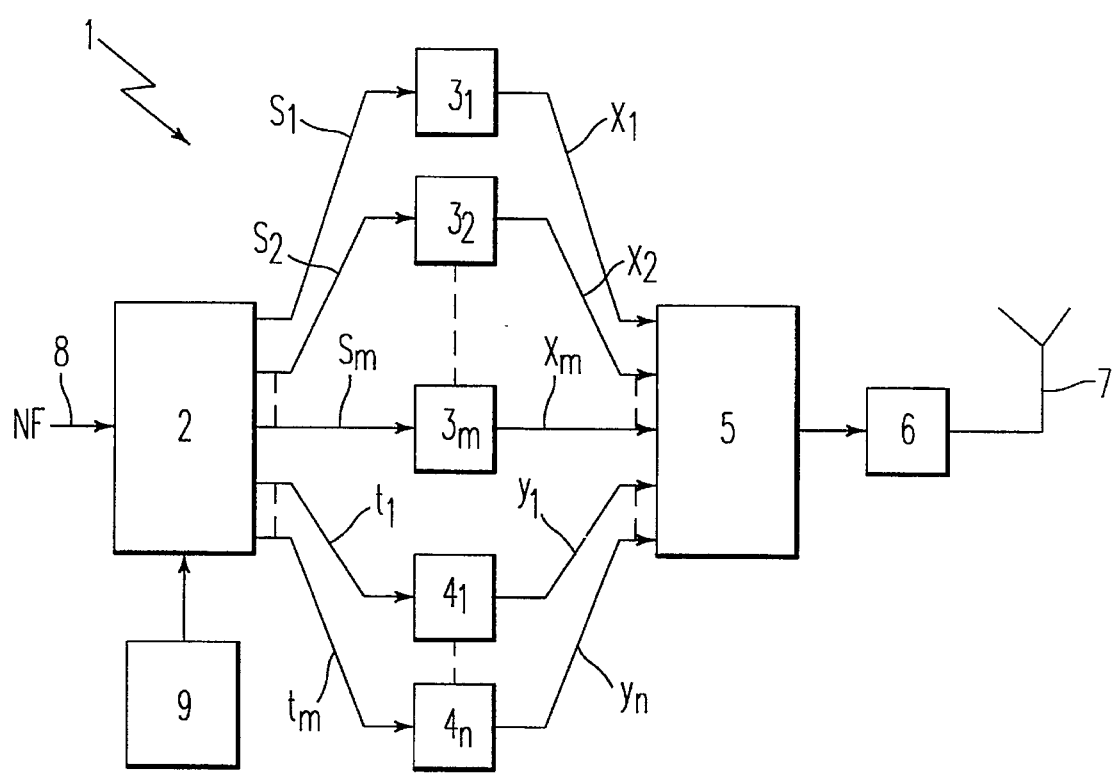
FIG. 2 is a block diagram of a modulation amplifier, which exhibits the invention, according to a first embodiment.

FIG. 2 is a block diagram of a modulation amplifier (1), which can be used for the modulation explained above. Let us call this kind of modulation a high frequency pulse stage modulation (HF-PSM), after the pulse stage modulation (PSM), which is known from several older patents and where direct current sources are added.

Such a HF-PSM modulation amplifier (1) comprises a signal converter (2), a high frequency oscillator (9), a summator (5) and a plurality of independently driven high frequency stages ($3_{1-m}$ or $4_{1-n}$). A low pass filter (6) can be attached to the output of the summator (5). The low pass filter (6) in turn can be connected to a load (7), shown here as the antenna.

The high frequency stages ($3_{1-m}$) are driven by the control signals ($s_{1-m}$) of the signal converter and emits to its outputs the high frequency and preferably power-amplified output signals ($x_{1-m}$). At the high frequency stages ($4_{1-n}$) the corresponding signals are called $t_{1-n}$ or $y_{1-n}$. These output signals ($x_{1-m}$ or $y_{1-n}$) are added in the summator.

A low frequency signal (NF) can be attached to the low frequency input (8) of the signal converter (2). At this stage that number of high frequency stages ($3_{1-m}$) can be selected in the signal converter (2) that the oscillation at the output of the summator exhibits a step-shaped envelop, which represents a coarse approximation of the amplified low frequency signal response. This number changes naturally in accordance with the response to the amplitude of the input signal (NF). The control signals ($s_{1-m}$) exhibit the frequency f0 and phase $\Phi 0$ of the high frequency oscillator. The output signals ($x_{1-m}$) exhibit the same frequency f0 and phase $\Phi 0$ and the same amplitude.

In addition to these equiphase driven stages ($3_{1-m}$), the high frequency stages ($4_{1-n}$) are now driven with different phase, but equifrequency control signals ($t_{1-n}$). The number of driven stages ($4_{1-n}$) and the phases $\Phi_{1-n}$ are specified in such a manner in the signal converter that the sum of the output signals ($y_{1-n}$) corresponds to the difference of the amplified low frequency amplitude response and the step-shaped envelop of the output signals ($x_{1-m}$). Thus, the output signals ($y_{1-n}$) exhibit the same amplitude and frequency f0, but different phases $\Phi_{1-n}$.

Consequently a signal that comprises the coarse approximation by means of the equiphased coarse stages ($3_{1-m}$) and the fine approximation by means of the different phased fine stages ($4_{1-n}$) is produced at the output of the summator. With the combination of equiphase driven coarse stages and different phase driven fine stages one can obtain a representation of the relevant low frequency signal, which is virtually without noise.

As explained above, the number of selected fine stages ($4_{1-n}$) should be greater than or equal to 2.

In a first embodiment the number of coarse stages ($3_{1-m}$) is greater than that of the fine stages ($4_{1-n}$); and n is in particular 2.

Figure 5:
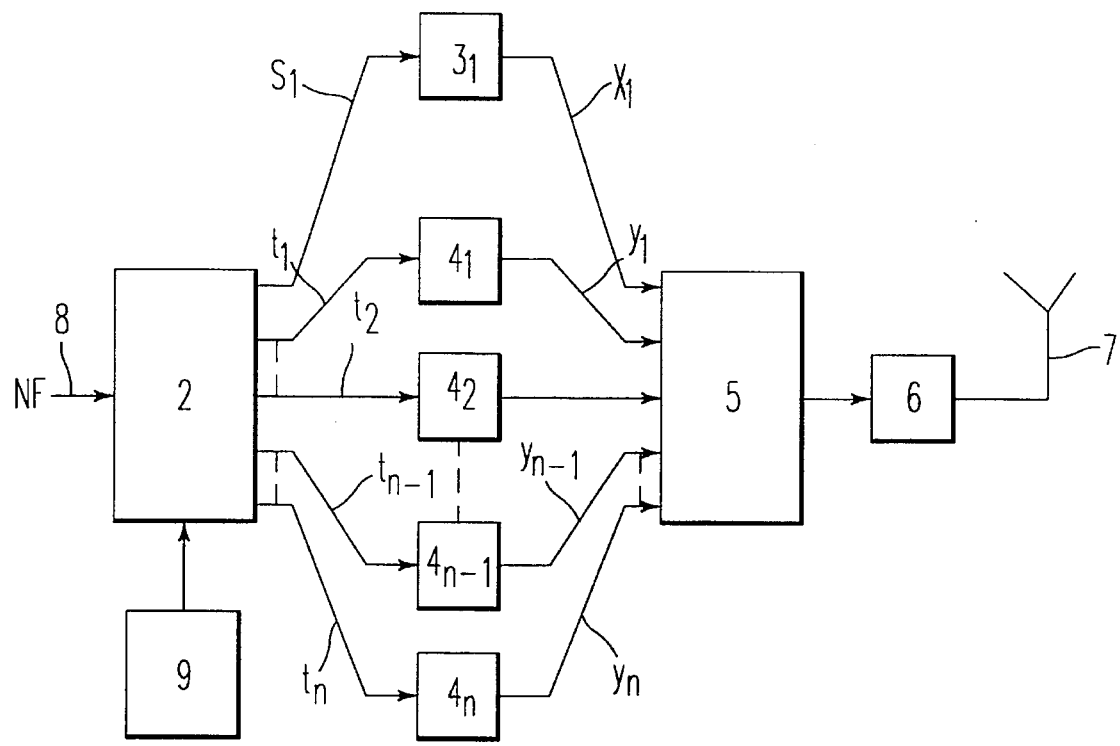
FIG. 5 is a block diagram of a modulation amplifier, which exhibits the invention, according to a second embodiment.

Another embodiment is characterized in that the number of equiphase driven high frequency stages ($3_{1-m}$) is smaller than that of the stages ($4_{1-n}$) driven with different phases $\Phi_{1-n}$. In such a modulation amplifier the stages ($4_{1-n}$) driven with different phases assume an increasing larger proportion of the total transmitter power. In the extreme case, shown in FIG. 5, m=1. That is, only a single stage is selected now with control signals, which exhibit the same phase $\Phi 0$ as the high frequency oscillator (9).

The result of such an arrangement is a modulation amplifier, whose output amplitude response is produced by a finite sum of the high frequency oscillations that exhibit different phases. By determining the phases and the number of selected stages the output amplitude can be arbitrarily modified in accordance with the low frequency input signal. The output amplitude can be adjusted from zero virtually continuously up to a maximum value. The maximum value is obtained by adding the output signals of all stages and the equiphase selection. The response of the output amplitude becomes thus very smooth and exhibits hardly any steps. Thus, interferences can be largely avoided. Such a modulation amplifier is thus superior to the state of the art with respect to the distortion factor.

Figure 6:
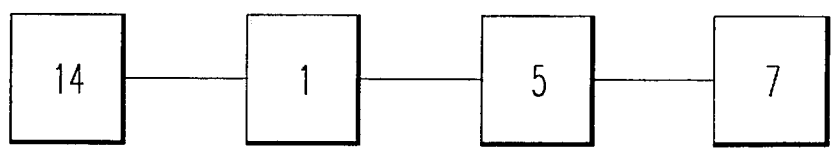
FIG. 6 is a block diagram of a radio transmitter with a modulation amplifier according to the invention.

Both embodiments have in common that they can be installed into a radio transmitter comprising a low frequency signal source (14), a low pass filter (6) for smoothing the transmitting signal and a load (7), usually in the form of an antenna. For this purpose the modulation amplifier (1) according to the invention is connected between the low frequency signal source (14) and the low pass (6). This configuration is shown in FIG. 6.

Figure 7:
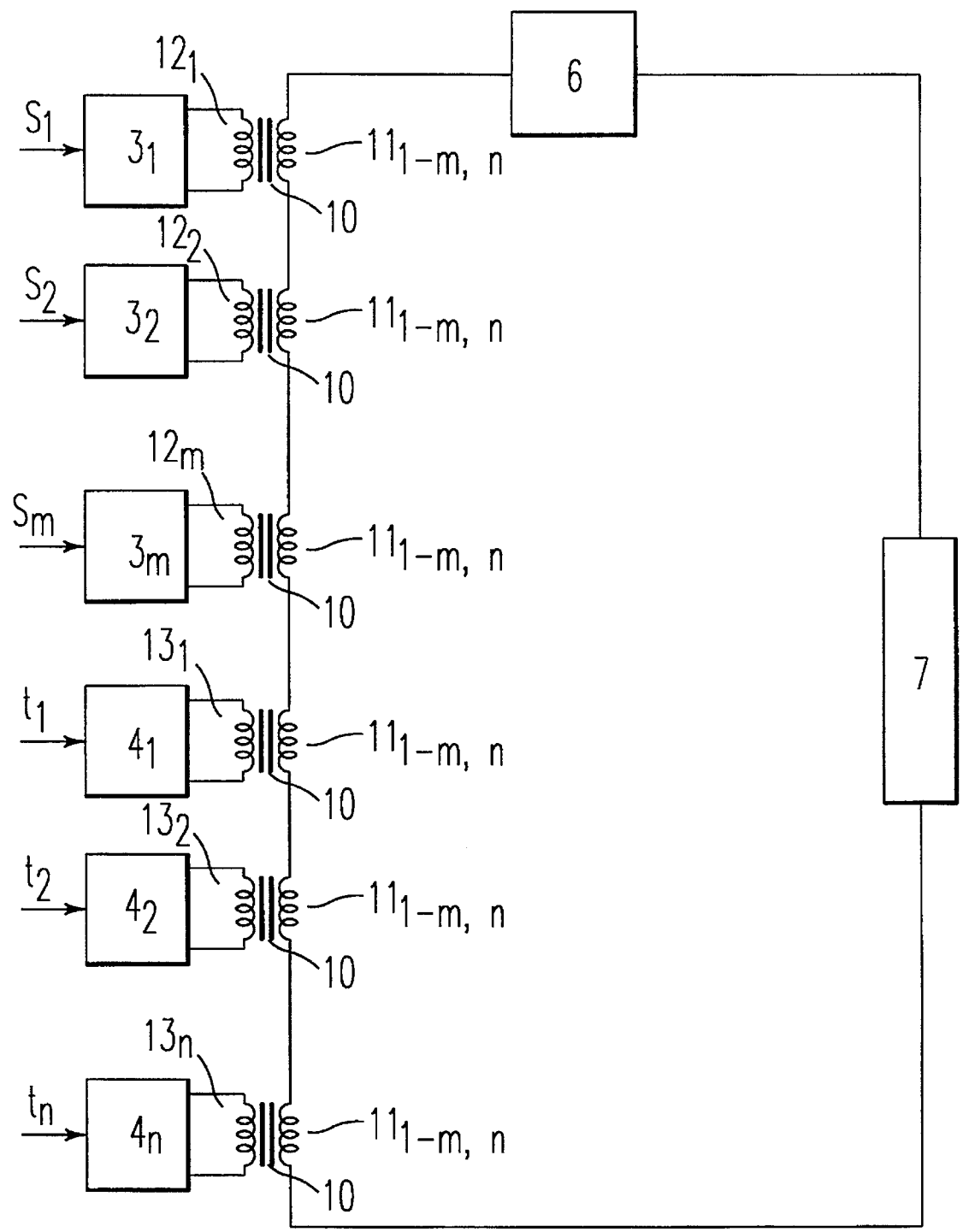
FIG. 7 depicts the output circuit of a radio transmitter, which exhibits the invention, according to a first modification.
Figure 8:
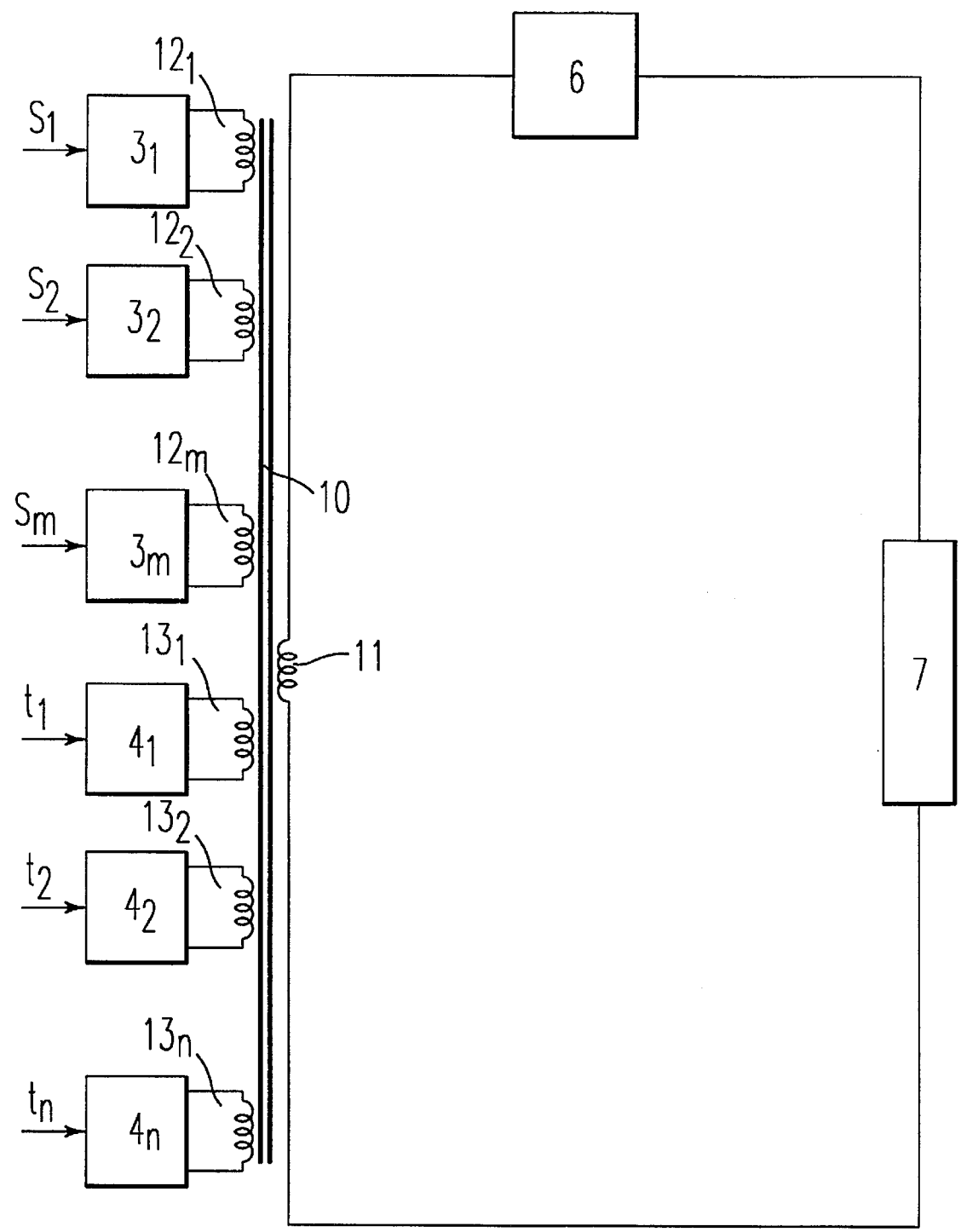
FIG. 8 depicts the output circuit of a radio transmitter, which exhibits the invention, according to a second modification.

The summator (5) of the modulation amplifier (1) of the invention is designed preferably as a transformer (10). This transformer (10) exhibits per high frequency stage one primary winding ($12_{1-m}$, $13_{1-n}$) and a secondary winding (11) (see FIG. 8). A second modification exhibits n+m transformers with primary windings ($12_{1-m}$, $13_{1-n}$) and secondary windings ($11_{1-m,n}$) connected in series (see FIG. 7).

The control signals ($s_{1-m}$ or $t_{1-n}$) can also comprise physical lines. For example, three lines are conceivable: one, to which the phase $\Phi 0$ of the oscillator is assigned, and two, which are assigned to the positive or phase shift of the corresponding stage. The signal converter (2) decides then which line is loaded with which signals. The result is that the stages ($3_{1-m}$ or $4_{1-n}$) can also be exchanged arbitrarily with respect to the physical lines of the control signals ($s_{1-m}$ or $t_{1-n}$).

Of course, the groups of stages can be divided arbitrarily. Since all stages are constructed in principle the same and are only driven differently, when a stage becomes defective, any other stage can assume its function. Furthermore, it is conceivable that different stages of one or the other group can belong to different times. A uniform loading of the stages is also obtained by driving different stages at different times for uniform (also constant) output amplitude values.

Thus, the assignment of stages can be specified arbitrarily in the signal converter (2). Owing to this condition, owing to the totally similar construction of the stages, and owing to the arbitrary selection by means of the signal converter (2) a modulation amplifier is obtained that is characterized by a construction that is extraordinarily flexible and sturdy.

We claim:

1. Modulation amplifier comprising
a) a signal converter, which converts a low frequency signal, applied to a low frequency input, into a first group of m(m≧1) control signals ($s_{1-m}$);
b) a high frequency oscillator, which emits a high frequency signal of frequency $f_0$ and phase $\Phi_0$;
c) m high frequency stages ($3_{1-m}$), which can be driven independently and which are driven by the control signals ($s_{1-m}$) and emit in the turned on state high frequency signals of frequency $f_0$, phase $\Phi_0$ and identical amplitude to their outputs ($x_{1-m}$);
d) a summator, which adds the outputs ($x_{1-m}$) of the high frequency stages ($3_{1-m}$), and sends the composite signal on to a low pass filter, to whose output a load can be attached, whereby
e) the signal converter drives so many high frequency stages ($3_{1-m}$) that the output signal of the summator represents a power-amplified, high frequency oscillation, whose amplitude changes by steps in accordance with the low frequency signal; and
f) means for approximating the difference of the amplified amplitude of the low frequency signal and step-shaped output signal of the summator; wherein
g) the means for approximating the difference of the amplified amplitude of the low frequency signal and step-shaped output signal of the summator include a second group of n, n≧2, independently driven high frequency stages ($4_{1-n}$), which
h) are driven by a second group of n high frequency control signals ($t_{1-n}$), which originate from the signal converter and exhibit the same frequency $f_0$, but different phase $\Phi_{1-n}$, and
i) said high frequency stages ($4_{1-n}$) send to their outputs ($y_{1-n}$) high frequency signals of frequency $f_0$, identical amplitude, but different phase $\Phi_{1-n}$, whereby
j) the signal converter determines in such a manner the number of selected high frequency stages ($4_{1-n}$) and their phases ($\Phi_{1-n}$) that the sum of the output signals ($y_{1-n}$) of the second group of high frequency stages ($4_{1-n}$) represents a high frequency oscillation, whose amplitude corresponds to the difference of the amplified low frequency signal and the step-shaped representation of the low frequency signal by means of the high frequency stages ($3_{1-m}$).

2. Modulation amplifier, as claimed in claim 1, wherein the number of high frequency stages ($3_{1-m}$) is greater or equal to the number of high frequency stages ($4_{1-n}$), thus m≧n.

3. Modulation amplifier, as claimed in claim 2, wherein the number of high frequency stages ($3_{1-m}$) is greater than the number of high frequency stages ($4_{1-n}$), thus m≧n, and in particular n=2.

4. Modulation amplifier, as claimed in claim 1, wherein the number of high frequency stages ($4_{1-n}$) is greater than or equal to the number of high frequency stages ($3_{1-n}$), thus n≧m.

5. Modulation amplifier, as claimed in claim 4, wherein the number of high frequency stages ($4_{1-n}$) is greater than the number of high frequency stages ($3_{1-m}$), thus n≧m, and in particular m=1.

6. Modulation amplifier, as claimed in any one of the preceding claims, wherein a) the output of the high frequency oscillator is connected to the signal converter; and b) the control signals ($s_{1-m}$) are high frequency and exhibit the same phase $\Phi_0$ and frequency $f_0$, like the high frequency oscillator.

7. Modulation amplifier, as claimed in any one of the preceding claims, wherein the summator comprises at least one transformer.

8. Modulation amplifier, as claimed in claim 7, wherein the transformer comprises several primary windings ($12_{1-m}$ or $13_{1-n}$), which are assigned to one of the high frequency stages ($3_{1-m}$ or $4_{1-n}$), and a single secondary winding, which is connected to the low pass and the load.

9. Modulation amplifier, as claimed in claim 8, wherein the summator comprises n+m transformers with primary windings ($12_{1-m}$ or $13_{1-n}$), which are assigned to one of the high frequency stages ($3_{1-m}$ or $4_{1-n}$), and with secondary windings ($11_{1-m,n}$), which are connected in series to the low pass and the load.

10. A radio transmitter comprising:

a low frequency source;

a modulation amplifier;

a load;

a low pass filter disposed between said modulation amplifier and said load;

said modulation amplifier including:

a) a signal converter, which converts a low frequency signal, applied to a low frequency input, into a first group of m(m≧1) control signals ($s_{1-m}$);

b) a high frequency oscillator, which emits a high frequency signal of frequency $f_0$ and phase $\Phi_0$;

c) m high frequency stages ($3_{1-m}$), which can be driven independently and which are driven by the control signals ($s_{1-m}$) and emit in the turned on state high frequency signals of frequency $f_0$, phase $\Phi_0$ and identical amplitude to their outputs ($x_{1-m}$);

d) a summator, which adds the outputs ($x_{1-m}$) of the high frequency stages ($3_{1-m}$), and sends the composite signal on to a low pass filter, to whose output a load can be attached, whereby e) the signal converter drives so many high frequency stages ($3_{1-m}$) that the output signal of the summator represents a power-amplified, high frequency oscillation, whose amplitude changes by steps in accordance with the low frequency signal; and f) means for approximating the difference of the amplified amplitude of the low frequency signal and step-shaped output signal of the summator; wherein g) the means for approximating the difference of the amplified amplitude of the low frequency signal and step-shaped output signal of the summator include a second group of n, n≧2, independently driven high frequency stages ($4_{1-n}$), which h) are driven by a second group of n high frequency control signals ($t_{1-n}$), which originate from the signal converter and exhibit the same frequency $f_0$, but different phase $\Phi_{1-n}$, and i) said high frequency stages ($4_{1-n}$) send to their outputs ($y_{1-n}$) high frequency signals of frequency $f_0$, identical amplitude, but different phase $\Phi_{1-n}$, whereby j) the signal converter determines in such a manner the number of selected high frequency stages ($4_{1-n}$) and their phases ($\Phi_{1-n}$) that the sum of the output signals ($y_{1-n}$) of the second group of high frequency stages ($4_{1-n}$) represents a high frequency oscillation, whose amplitude corresponds to the difference of the amplified low frequency signal and the step-shaped representation of the low frequency signal by means of the high frequency stages ($3_{1-m}$), wherein the number of high frequency stages ($3_{1-m}$) is greater than the number of high frequency stages ($4_{1-n}$), thus m≧n, and in particular n=2.

11. A radio transmitter comprising:

a low frequency source;

a modulation amplifier;

a load;

a low pass filter disposed between said modulation amplifier and said load;

said modulation amplifier including:

a) a signal converter, which converts a low frequency signal, applied to a low frequency input, into a first group of m(m≧1) control signals ($s_{1-m}$);

b) a high frequency oscillator, which emits a high frequency signal of frequency $f_0$ and phase $\Phi_0$;

c) m high frequency stages ($3_{1-m}$), which can be driven independently and which are driven by the control signals ($s_{1-m}$) and emit in the turned on state high frequency signals of frequency $f_0$, phase $\Phi_0$ and identical amplitude to their outputs ($x_{1-m}$);

d) a summator, which adds the outputs ($x_{1-m}$) of the high frequency stages ($3_{1-m}$), and sends the composite signal on to a low pass filter, to whose output a load can be attached, whereby e) the signal converter drives so many high frequency stages ($3_{1-m}$) that the output signal of the summator represents a power-amplified, high frequency oscillation, whose amplitude changes by steps in accordance with the low frequency signal; and f) means for approximating the difference of the amplified amplitude of the low frequency signal and step-shaped output signal of the summator; wherein g) the means for approximating the difference of the amplified amplitude of the low frequency signal and step-shaped output signal of the summator include a second group of n, n≧2, independently driven high frequency stages ($4_{1-n}$), which h) are driven by a second group of n high frequency control signals ($t_{1-n}$), which originate from the signal converter and exhibit the same frequency $f_0$, but different phase $\Phi_{1-n}$, and i) said high frequency stages ($4_{1-n}$) send to their outputs ($y_{1-n}$) high frequency signals of frequency $f_0$, identical amplitude, but different phase $\Phi_{1-n}$, whereby j) the signal converter determines in such a manner the number of selected high frequency stages ($4_{1-n}$) and their phases ($\Phi_{1-n}$) that the sum of the output signals ($y_{1-n}$) of the second group of high frequency stages ($4_{1-n}$) represents a high frequency oscillation, whose amplitude corresponds to the difference of the amplified low frequency signal and the step-shaped representation of the low frequency signal by means of the high frequency stages ($3_{1-m}$), wherein the number of high frequency stages ($4_{1-n}$) is greater than the number of high frequency stages ($3_{1-m}$), thus n≧m, and in particular m=1.

\* \* \* \* \*